United States Patent [19]
Liu et al.

[11] Patent Number: 5,885,895
[45] Date of Patent: Mar. 23, 1999

[54] METHOD OF FORMING A SELF-ALIGNED CONTACT OF A DRAM CELL

[75] Inventors: Ming-Hua Liu, Taichung; Chuck Chen, Fenshan, both of Taiwan

[73] Assignee: United Microelectronics Corporation, Taipei, Taiwan

[21] Appl. No.: 826,143

[22] Filed: Mar. 27, 1997

[30] Foreign Application Priority Data

Feb. 22, 1997 [TW] Taiwan ................................. 86102161

[51] Int. Cl.$^6$ ............................................. H01L 21/8242
[52] U.S. Cl. ..................... 438/637; 438/639; 438/396; 438/586
[58] Field of Search ................................ 438/636, 639, 438/624; 148/DIG. 20

[56] References Cited

U.S. PATENT DOCUMENTS

| | | | |
|---|---|---|---|
| 5,275,972 | 1/1994 | Ogawa et al. | 438/639 |
| 5,356,834 | 10/1994 | Sugimoto et al. | 438/624 |
| 5,413,961 | 5/1995 | Kim | 148/DIG. 20 |
| 5,668,052 | 9/1997 | Matsumoto et al. | 438/636 |

*Primary Examiner*—Peter Toby Brown
*Assistant Examiner*—Maria Guerrero
*Attorney, Agent, or Firm*—Rabin & Champagne, P.C.

[57] ABSTRACT

A method of forming a self-aligned contact of a DRAM cell includes providing a substrate having a MOS transistor. The MOS transistor includes a gate and a source/drain region. A first insulating layer, a second insulating layer and a third insulating layer are formed over the surface of the substrate in succession. The third insulating layer is planarized. A contact window mask is formed above the third insulating layer. Using the contact window mask as a cover, the third insulating layer is removed using anisotropic dry etching and isotropic wet etching. Then, a portion of the second insulating layer and a portion of the first insulating layer are removed sequentially to expose the source/drain region so that a self-aligned contact is formed.

8 Claims, 7 Drawing Sheets

METHOD OF FORMING A SELF-ALIGNED CONTACT OF A DRAM CELL

BACKGROUND OF THE INVENTION

1. Field of the Invention

The present invention relates in general to a method of making integrated circuits (ICs), and more particularly to a method of forming a self-aligned contact of a dynamic random access memory (DRAM) cell. The method improves the electrical connection between a substrate and a wireline by improving the process of etching the self-aligned contact.

2. Description of the Related Art

In the conventional manufacturing process of DRAM cells, after a metal-oxide-semiconductor (MOS) transistor is formed, the forming of insulating layers, the etching of contact windows, and the construction of interconnections are successive and important processes. A widely used technique, known as the self-aligned contact (SAC) technique, is typically used to connect a substrate and a wireline together. The SAC technique further includes the planarization of an upper insulation layer.

Figure 1:
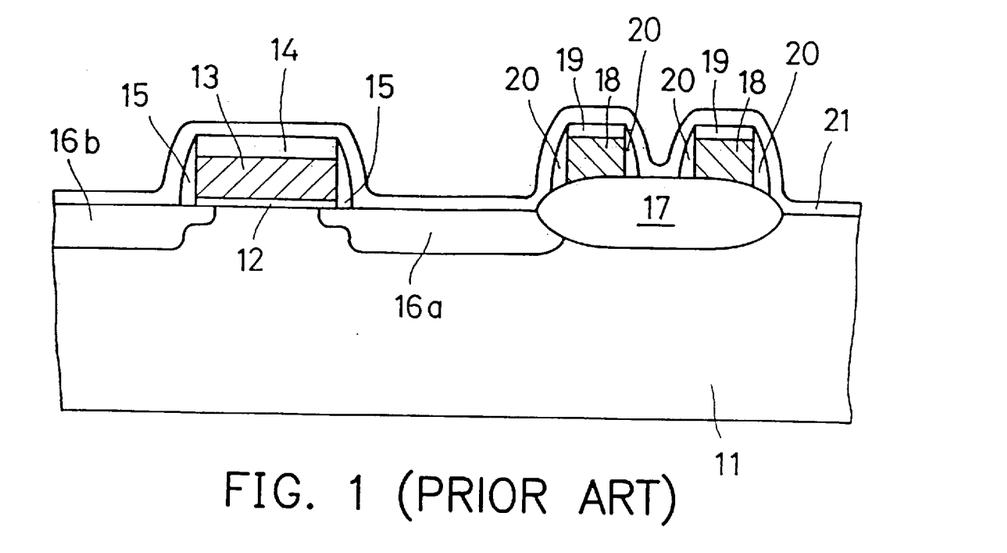
FIG. 1 through FIG. 6 are cross-sectional views showing the conventional process steps of forming a self-aligned contact.

FIGS. 1 through 6 illustrate the conventional manufacturing process of forming a self-aligned contact for a DRAM cell. Referring to FIG. 1, a substrate 11 having a metal-oxide-semiconductor (MOS) transistor thereon is illustrated. The MOS transistor includes a gate 13 of doped polysilicon, and source/drain regions 16a, 16b. A gate oxide layer 12 is formed under the gate 13. A cap oxide layer 14 is formed on the gate 13. A spacer 15 is formed on the sidewall of the gate 13. The source/drain regions 16a, 16b have a lightly doped drain structure (LDD). Further, other components of the DRAM cell are formed on the substrate 11, for example, a field oxide layer 17, wirelines 18, a cap oxide layer 19 formed on a respective wireline 18, and a spacer 20 located around the respective wireline 18. An interpoly dielectric (IPD) layer 21 is deposited over the structure described above. The IPD layer 21 is preferably comprised of silicon oxide having a thickness of between 1500 Å and 2500 Å.

Figure 2:
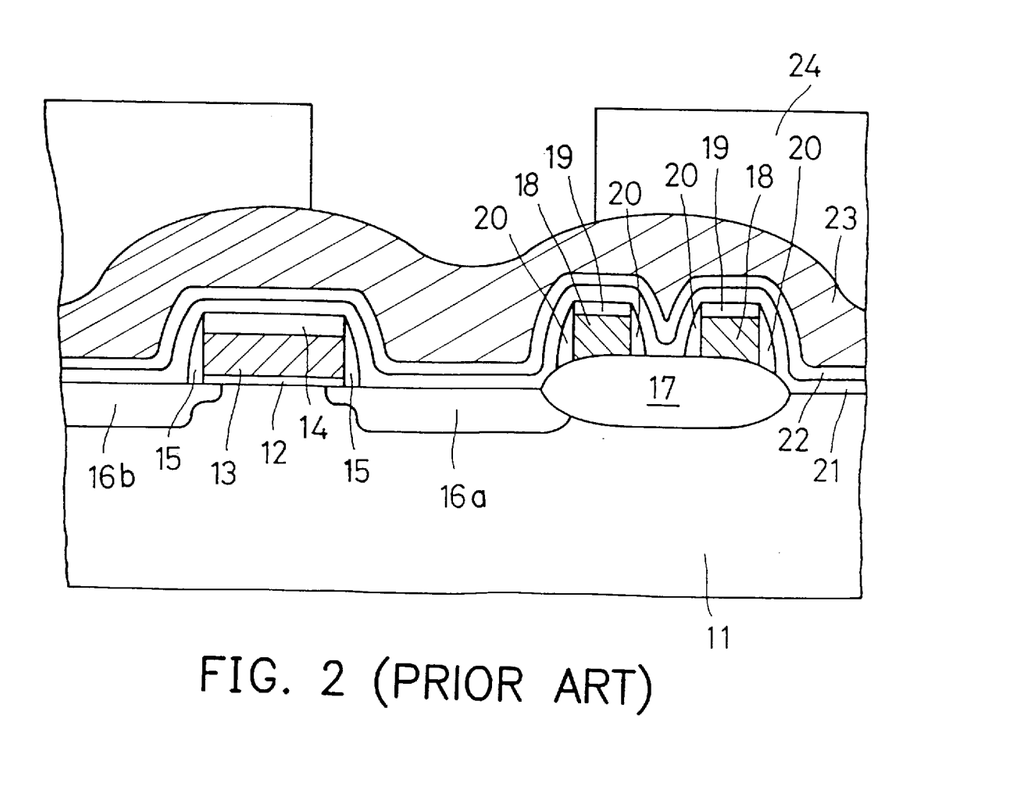

Referring to FIG. 2, a silicon nitride layer 22 is deposited over the IPD layer 21 using chemical vapor deposition (CVD) to a thickness of between 300 Å and 600 Å. Then, a thicker oxide layer 23 is deposited over the silicon nitride layer 22 using CVD to a thickness of between 5000 Å and 8000 Å. The oxide layer 23 is planarized by etching back. Alternatively, the planarized oxide layer 23 can be replaced with a layer of borophosphosilicate glass (BPSG) deposited by CVD which is planarized by reflow. A layer of photoresist 24 is spun-coated on the top of the planarized oxide layer 23, and then developed and fixed, leaving the region above the source/drain region 16a exposed.

Figure 3:
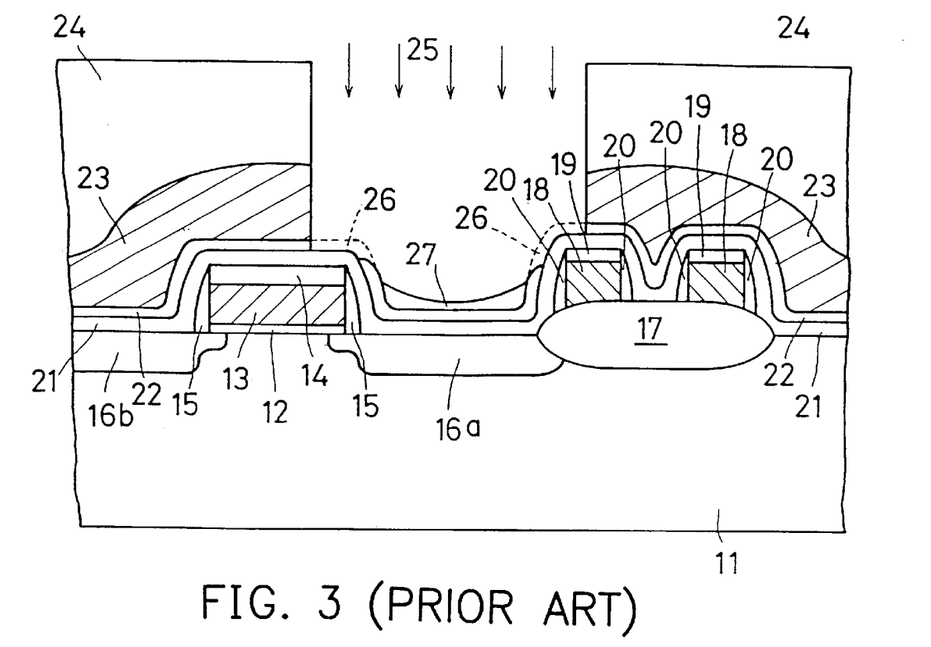

Referring to FIG. 3, using the layer of photoresist 24 as a mask, the oxide layer 23 is etched away. The traditional method of etching the planarized oxide layer 23 uses the silicon nitride layer 22 as a stop layer. The oxide layer 23 is etched using anisotropic dry etching, as indicated by the arrows 25 in FIG. 3. Because of the planarization of the oxide layer 23, the thickness of the oxide layer 23 above the source/drain region 16a is not uniform. Further, dry etching has a low selectivity (the dry etching selectivity rate of nitride to oxide is normally 1:10~1:12). As such, overetching occurs easily. For example, the etching process may etch a portion of the stop layer 22, as shown by the dotted line region 26 in FIG. 3; or else, some residues may remain after the etching process is completed, such as the residuary silicon oxide 27 shown in FIG. 3.

Figure 4:
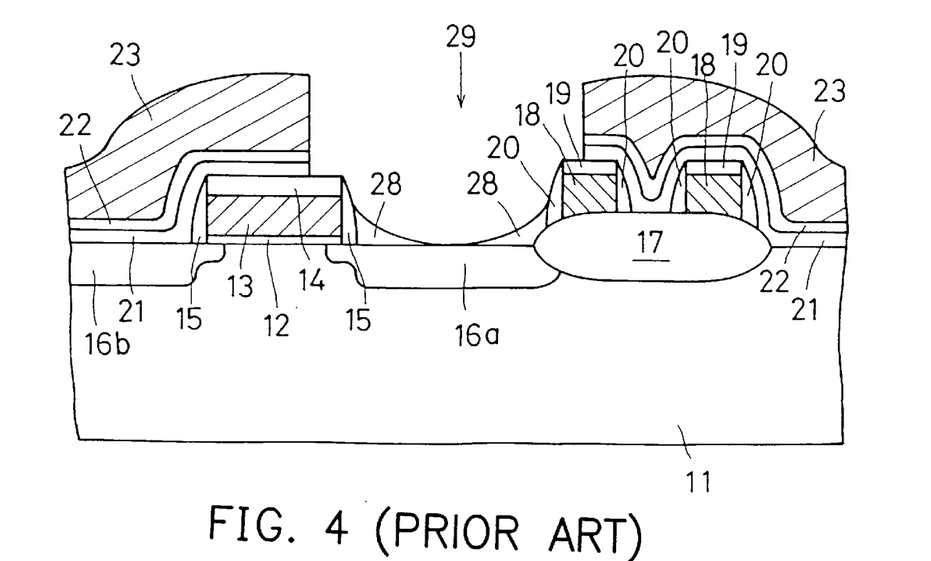

The etching of the silicon nitride layer 22 and the IPD layer 21 is performed successively using conventional anisotropic dry etching. Because of spacers 15, 20 and cap oxide layers 14, 19, the etching processes described above will self align with the source/drain region 16a to form a contact window 29, without etching the regions of the gate 13 or the wirelines 18. Because of residues formed, during the previous process, on the bottom of the contact window 29, that is, on the surface of the source/drain region 16a, some etching residues 28 may remain, as shown in FIG. 4. Then, the photoresist 24 is stripped to form the structure shown in FIG. 4.

Figure 5:
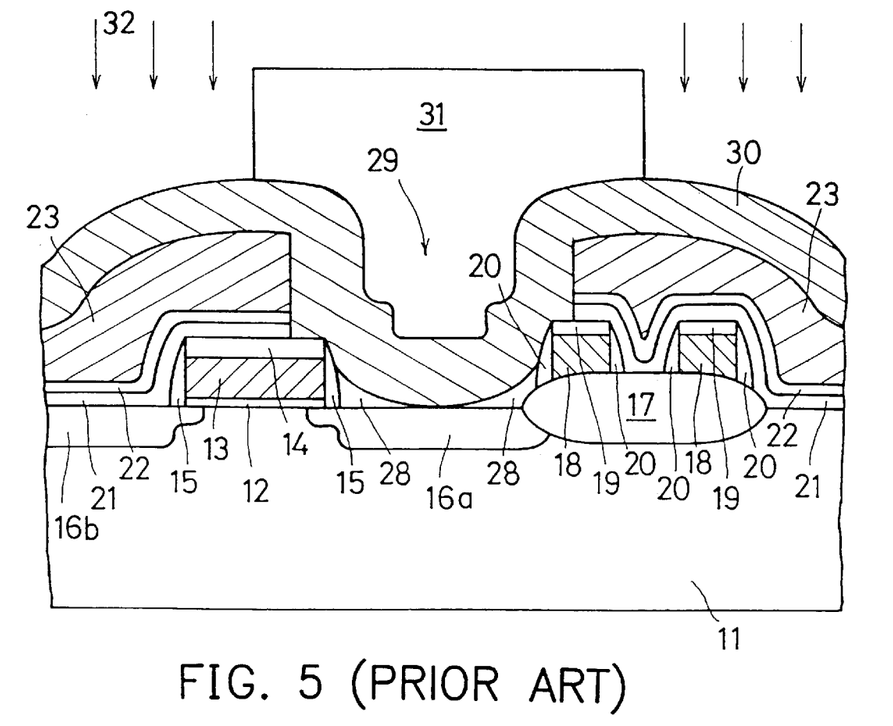

Referring to FIG. 5, a doped polysilicon layer 30 is deposited over the structure shown in FIG. 4. Then, a photoresist layer 31 is formed on the doped polysilicon layer 30 using a conventional photolithography process to cover the upper region of the contact window 29. The polysilicon layer 30 is etched using anisotropic dry etching, as indicated by the arrow 32 in FIG. 5.

Figure 6:
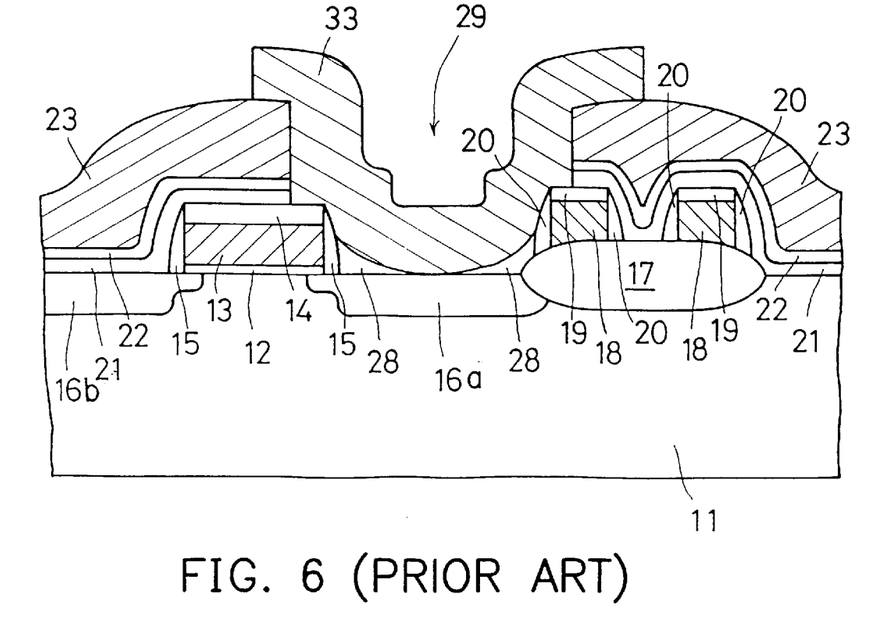

Referring to FIG. 6, a wireline 33 is formed by stripping the photoresist layer 31 to connect the source/drain region 16a. Thus, the entire manufacturing process of the self-aligned contact is performed.

Due to the low selectivity of anisotropic dry etching used in the known manufacturing processes, and because overetching of the silicon nitride layer 22 is to be avoided, the etching of the oxide silicon layer 23 results in residues. The residues will narrow the self-aligned contact window 29, resulting, in a possible disconnection between the wireline 33 and the source/drain region 16a.

SUMMARY OF THE INVENTION

It is therefore an object of the present invention to provide a process for forming a self-aligned contact in which the planarized oxide silicon layer and other insulating layers above the contact window are completely removed.

It is a further object of the present invention to provide such a process in which it is ensured that the electrical connection between the wireline and the source/drain region is present.

The invention achieves the above-identified objects by providing a new method of forming a self-aligned contact. First, a first insulating layer is formed over a silicon substrate having MOS transistors thereon. A second insulating layer and a third insulating layer are formed in succession. Then, the planarization of the third insulating layer is performed. The third insulating layer is patterned using both anisotropic dry etching and isotropic wet etching to remove a portion of the third insulating layer above the source/drain region. The second insulating layer and the first insulating layer are removed in succession to expose the surface of the substrate at the source/drain region. A self-aligned contact window is thus formed above the source/drain region.

In accordance with one preferred embodiment of the invention, the third planarized insulating layer is etched using both anisotropic dry etching and isotropic wet etching to enhance the effect of etching the third insulating layer which has a random thickness. Because of the better selectivity of isotropic wet etching, the invention avoids over etching. By improving the etching process of the third insulating layer, the processes of etching of the second and first insulating layers are also improved. Also, reducing residues results in a better connection between the wireline and the source/drain region.

BRIEF DESCRIPTION OF THE DRAWINGS

Other objects, features, and advantages of the invention will become apparent from the following detailed description of the preferred but non-limiting embodiment. The description is made with reference to the accompanying drawings in which.

DESCRIPTION OF THE PREFERRED EMBODIMENT

Figure 7:
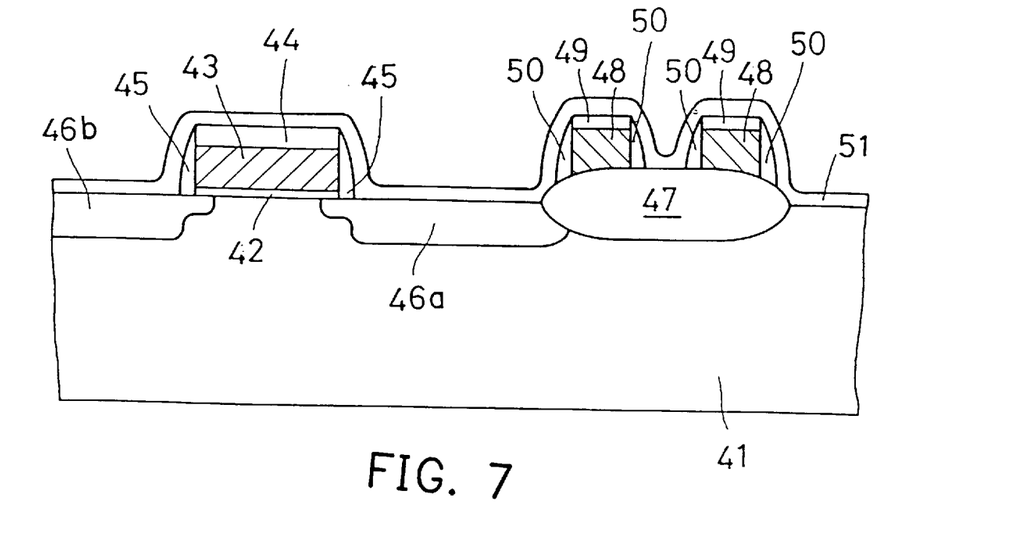
FIGS. 7 through 13 are cross-sectional views showing the process steps of forming a self-aligned contact in accordance with one preferred embodiment of the invention.

Referring to FIG. 7, a silicon substrate 41 having a MOS transistor thereon is shown. The MOS transistor includes a doped polysilicon gate 43 formed on the substrate 41, and source/drain regions 46a, 46b. A gate oxide layer 42 is formed under the gate 43. A cap oxide layer 44 is formed on the gate 43. A spacer 45 is formed on the sidewall of the gate 43. Generally, the source/drain regions 46a, 46b have a lightly doped drain (LDD) structure. Further, other related elements of the DRAM cell are formed on the substrate 41, for example, a field oxide layer 47, wirelines 48, a cap oxide layer 49 formed on the respective wirelines 48, and a spacer 50 located around the respective wirelines 48. An interpoly dielectric (IPD) layer 51 is deposited over the structure described above. The interpoly dielectric layer 51 is preferably comprised of silicon oxide, and has a thickness of between 1500 Å and 2500 Å.

Figure 8:
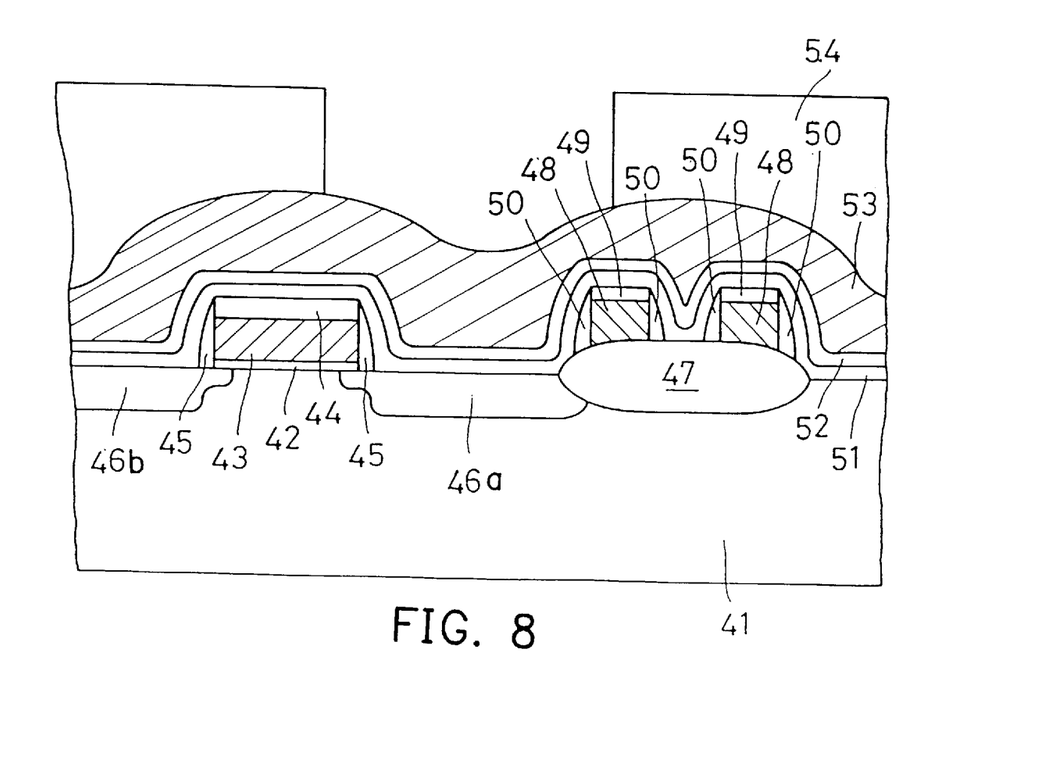

Referring to FIG. 8, a silicon nitride layer 52 is deposited over the IPD layer 51 using CVD to a thickness of between 300 Å and 600 Å. Then, a thicker oxide layer 53 is deposited over the silicon nitride layer 52 using CVD to a thickness of between 5000 Å and 8000 Å. The oxide layer 53 is planarized by etching back. Alternatively, the planarized oxide layer 53 can be replaced with a layer of borophosphosilicate glass (BPSG) deposited using CVD, and planarized using reflow. A layer of photoresist 54 is spun coated on the top of the planarized oxide layer 53, and then developed and fixed to leave the region above the source/drain region 46a exposed.

Figure 9:
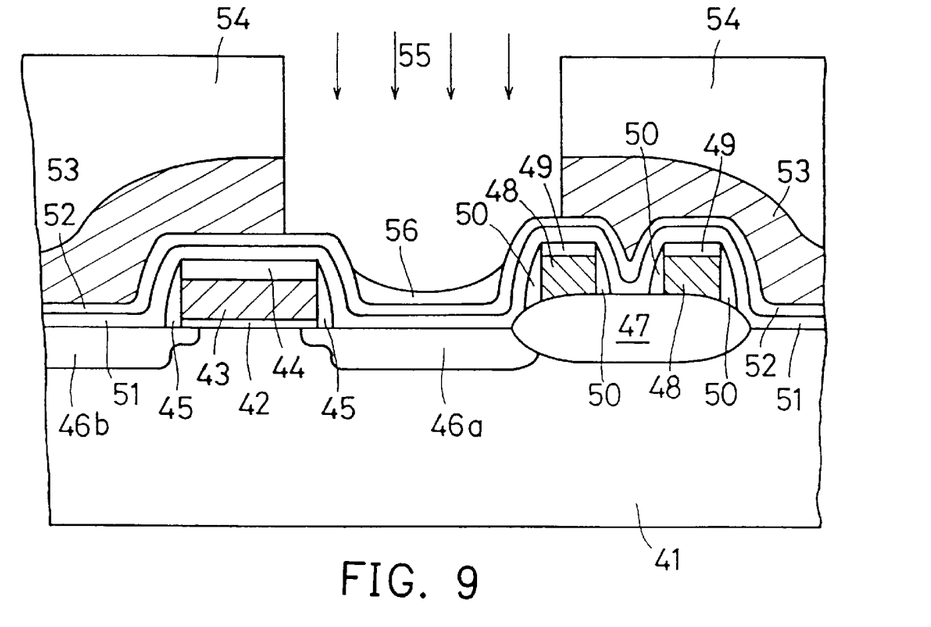

Referring to FIG. 9, using the layer of photoresist 54 as a mask and the silicon nitride layer 52 as a stop layer, a first etching process of the oxide layer 53 is performed using anisotropic dry etching, as indicated by the arrows 55 in FIG. 9. Because of the planarization of the oxide layer 53, the thickness of the oxide layer 53 above the source/drain region 46a is not uniform. To avoid over etching, the oxide layer 53 is etched until the silicon nitride layer 52 under the thinnest region of the oxide layer 53 is exposed. According to the etching process described above, residues 56 of the oxide layer 53 will remain.

Figure 10:
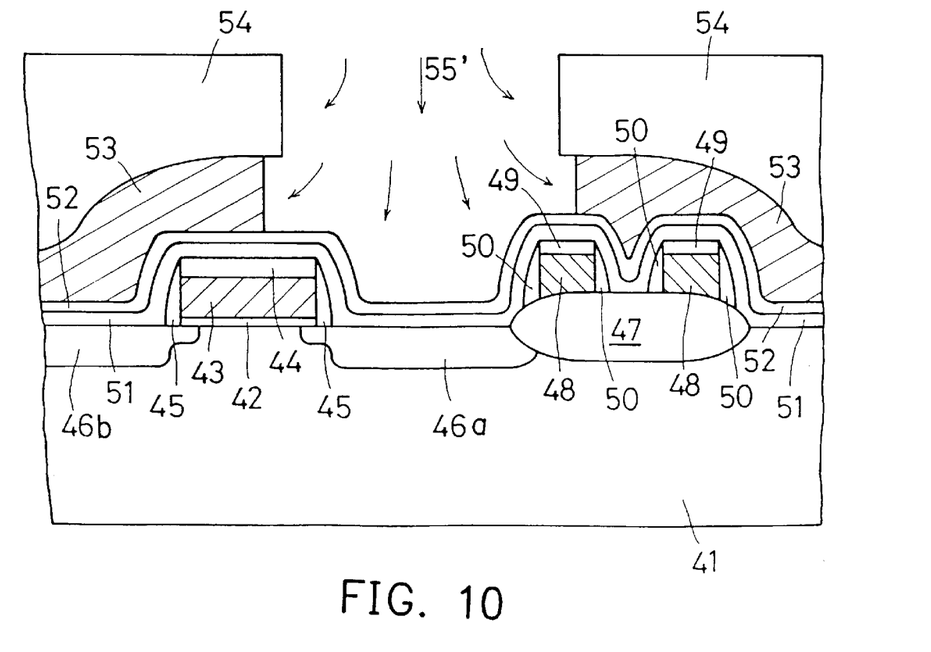

Referring to FIG. 10, a second etching process of the oxide layer 53 is performed using isotropic wet etching, as shown by the arrows 55', to remove the residues 56. Because of the better selectivity of isotropic wet etching, the second etching process avoids over etching of the silicon nitride layer 52. The order of the etching processes of the oxide layer 53 can be alternated, that is, the first etching process can use isotropic wet etching and the second etching process can use anisotropic dry etching. The etching processes are performed successively to remove the silicon nitride layer 52 and the IPD layer 51 until the surface of the source/drain region 46a is exposed. The presence of spacers 45, 50 and cap oxide layers 44, 49 will cause the etching processes described above to self-align the contact window 57 with source/drain region 46a, without etching the regions of the gate 43 or the wirelines 48. Because no residue remains in the previous process, the etching of the silicon nitride layer 52 and the IPD layer 51 is improved. The bottom of the contact window 57, that is, the surface of the source/drain region 46a, is free of residue. Then, the photoresist 54 is stripped to form the structure shown in FIG. 11.

Figure 11:
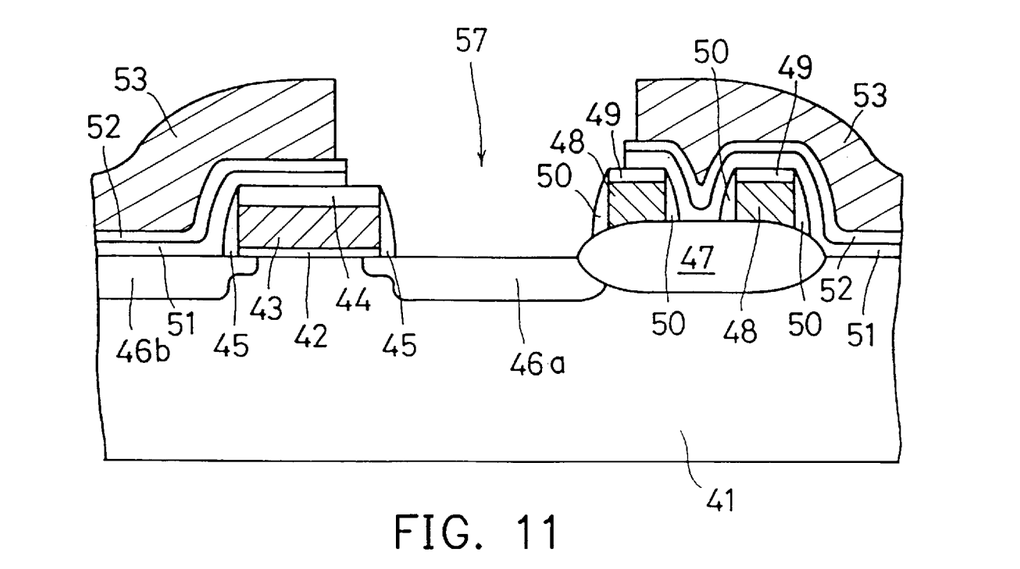
Figure 12:
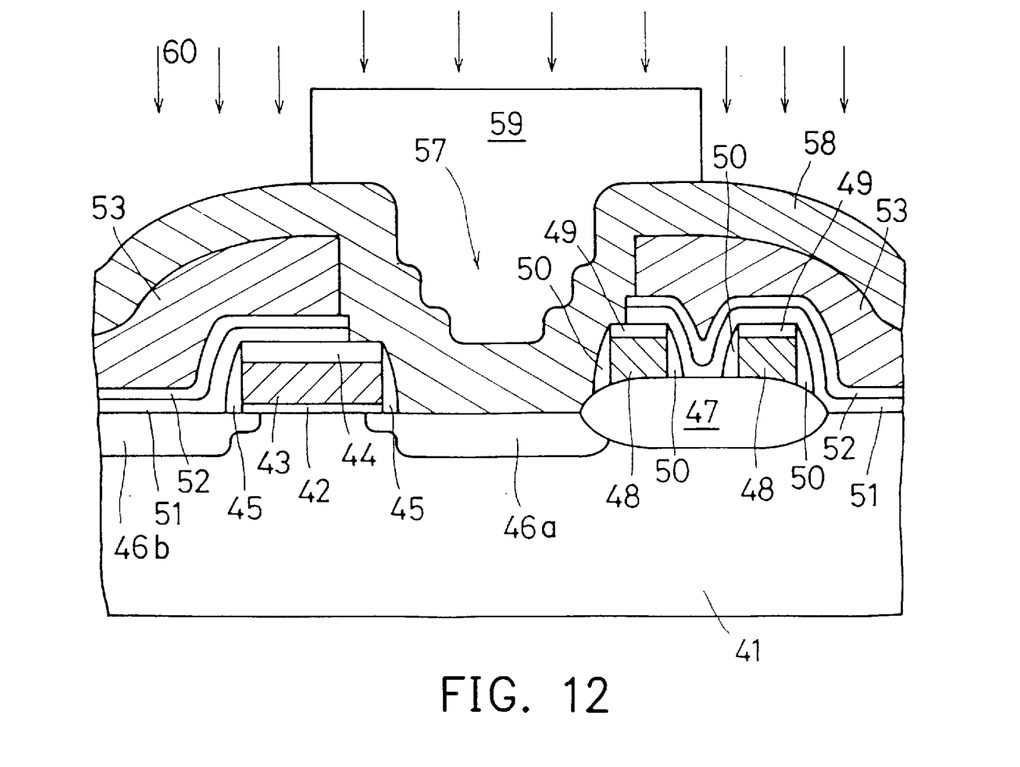

Referring to FIG. 12, a doped polysilicon layer 58 is deposited over the structure shown in FIG. 11. Then, a layer of photoresist 59 is formed on the doped polysilicon layer 58 using a conventional photolithography process to cover the upper region of the contact window 57. The polysilicon layer 58 is etched using anisotropic etching, as indicated by the arrows 60.

Figure 13:
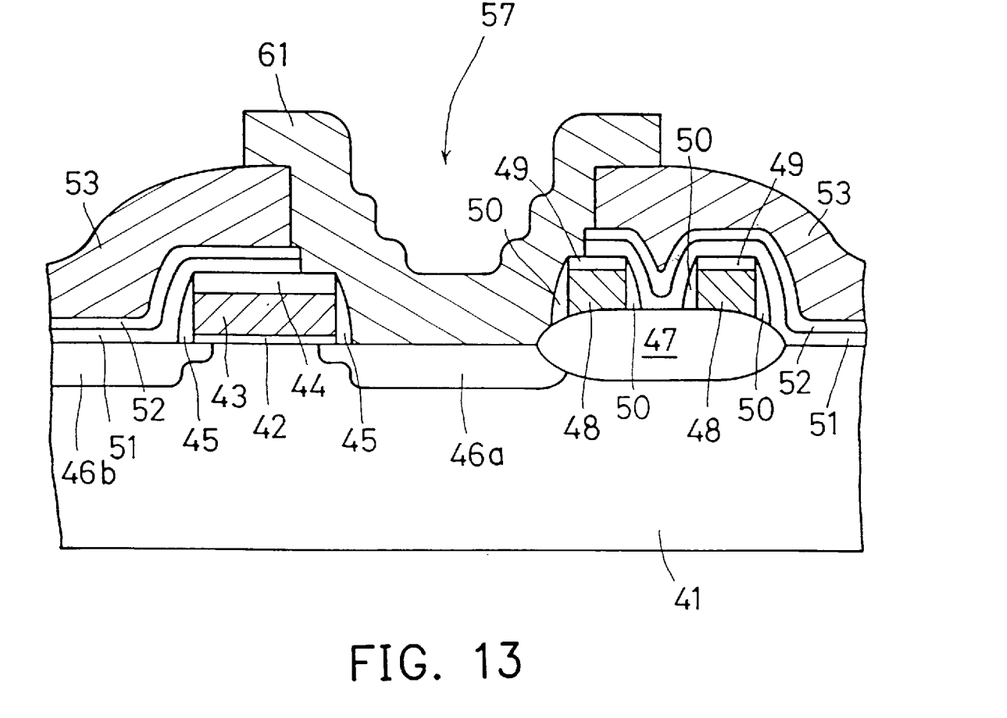

Referring to FIG. 13, a wireline 61 to connect to the source/drain region 46a is formed by stripping the layer of photoresist 59. Thus, the entire manufacturing process of the self-aligned contact is performed.

According to the preferred embodiment described above, the invention uses both anisotropic dry etching and isotropic wet etching to etch the planarized insulation layer, i.e., the planarized oxide layer 53 in the preferred embodiment. Because of the better selectivity of wet etching, the etching method of the invention improves the etching processes of the upper planarized insulating layer while ensuring over-etching of the lower insulating layer (i.e., the silicon nitride layer 52 in the preferred embodiment) does not occur. The etching of oxide being used as an example, the selectivity rate of dry etching is about 10:1 (oxide silicon:nitride silicon), while the selectivity rate of wet etching is about 100:1. Similarly, the method of the present invention improves the etching process to form a self-aligned contact, avoids an electrical disconnection between the wireline and the source/drain region, and therefore improves the quality of the DRAM cell.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of forming a self-aligned contact window of a dynamic random access memory cell, the cell including a substrate having a metal oxide semiconductor transistor formed thereon, the metal oxide semiconductor transistor having a source/drain region, comprising:

forming a first insulating layer over the substrate;

forming a second insulating layer over the first insulating layer;

forming a third insulating layer over the second insulating layer;

planarizing the third insulating layer;

removing a portion of the third insulating layer above the source/drain region using an anisotropic dry etching process until the second insulating layer is just exposed, leaving residues of the third insulating layer, followed by an isotropic wet etching process to remove the residues of the third insulating layer, and removing a portion of the second insulating layer and a portion of the first insulating layer above the source/drain region in succession, by successively performing the anisotropic dry etching process and the isotropic wet etching process again, to form a self-aligned contact window which exposes the source/drain region.

2. A method according to claim 1, wherein the first insulating layer comprises silicon oxide.

3. A method according to claim 1, wherein the second insulating layer comprises silicon nitride.

4. A method according to claim 1, wherein the third insulating layer comprises silicon oxide, and said planarizing includes etching back the third insulating layer to planarize the third insulating layer.

5. A method according to claim 1, wherein the third insulating layer comprises borophosphosilicate glass, and said planarizing includes reflow of the third insulating layer to planarize the third insulating layer.

6. A method of forming a self-aligned contact for a dynamic random access memory cell comprising conducting the method of claim 1, and further comprising:

forming a conducting layer in the contact window and contacting the source/drain region.

7. The method of claim 6, wherein the forming the conductive layer comprises:

forming a polysilicon layer over the substrate and filling the contact window; and removing a portion of the polysilicon layer.

8. The method of claim 7, wherein the removing a portion of the polysilicon layer comprises:

forming a photoresist layer, over a portion of the polysilicon layer, and etching away uncovered portions of the polysilicon layer.

* * * * *